United States Patent
Yamate et al.

[11] Patent Number: 5,822,174
[45] Date of Patent: Oct. 13, 1998

[54] MULTILAYER FEEDTHROUGH CAPACITOR

[75] Inventors: Kazunori Yamate, Ibaraki; Chikara Watanabe, Osaka, both of Japan

[73] Assignee: Matsushita Electric Industrial Co., Ltd., Osaka, Japan

[21] Appl. No.: 683,723

[22] Filed: Jul. 18, 1996

[30] Foreign Application Priority Data

Jul. 21, 1995 [JP] Japan ................................. 7-185229

[51] Int. Cl.[6] ........................... H01G 4/35; H01G 4/005; H01G 4/38; H01G 4/228
[52] U.S. Cl. ..................... 361/302; 361/303; 361/306.1; 361/306.3; 361/313; 361/329; 361/330
[58] Field of Search .......................... 361/302, 303–305, 361/306.1, 311–313, 320, 321.1, 321.2, 328–330, 306.3; 29/25.42; 174/143

[56] References Cited

U.S. PATENT DOCUMENTS

| | | | |
|---|---|---|---|
| 4,074,340 | 2/1978 | Leigh ....................................... | 361/330 |
| 4,665,465 | 5/1987 | Tanabe . | |
| 4,916,582 | 4/1990 | Okamura et al. . | |
| 4,947,286 | 8/1990 | Kaneko et al. ......................... | 361/330 |
| 5,099,387 | 3/1992 | Kato et al. . | |
| 5,590,016 | 12/1996 | Fujishiro et al. ....................... | 361/313 |

FOREIGN PATENT DOCUMENTS

| | | |
|---|---|---|
| 1-265509 | 10/1989 | Japan . |
| 6-84695 | 3/1994 | Japan . |
| 6-151244 | 5/1994 | Japan . |

*Primary Examiner*—Bot L. Ledynh
*Attorney, Agent, or Firm*—Ratner & Prestia

[57] ABSTRACT

A multilayer feedthrough capacitor of the present invention has an internal structure of stacking one over another alternately dielectric sheets $1a$, on each of which signal feedthrough electrodes $2a$, $2b$ and $2c$ and separating earth electrodes $7a$ and $7b$ are disposed alternately, and dielectric sheets $1b$, on each of which earth electrodes $3a$ and $3b$ having protrusions $8a$ and $8b$, respectively, are formed. On one pair of the end surfaces of this stacked dielectric body are formed first external electrodes $4a$, $4b$ and $4c$ that are connected to signal feedthrough electrodes $2a$, $2b$ and $2c$, respectively, and third external electrodes $9a$ and $9b$ that are connected to both separating earth electrodes $7a$ and $7b$ and protrusions $8a$ and $8b$, respectively. On the other pair of the end surfaces are formed second external electrodes $5a$ and $5b$ that are connected to earth electrodes $3a$ and $3b$, respectively. By having separating earth electrodes $7a$ and $7b$ arranged between signal feedthrough electrodes $2a$, $2b$ and $2c$, it has become possible to suppress generation of crosstalk and also to improve insertion loss characteristics in the high frequency band.

6 Claims, 8 Drawing Sheets

MULTILAYER FEEDTHROUGH CAPACITOR

BACKGROUND OF THE INVENTION

The present invention relates to a multilayer feed through capacitor for use in electric circuits composing a noise filter and the like.

Figure 9:
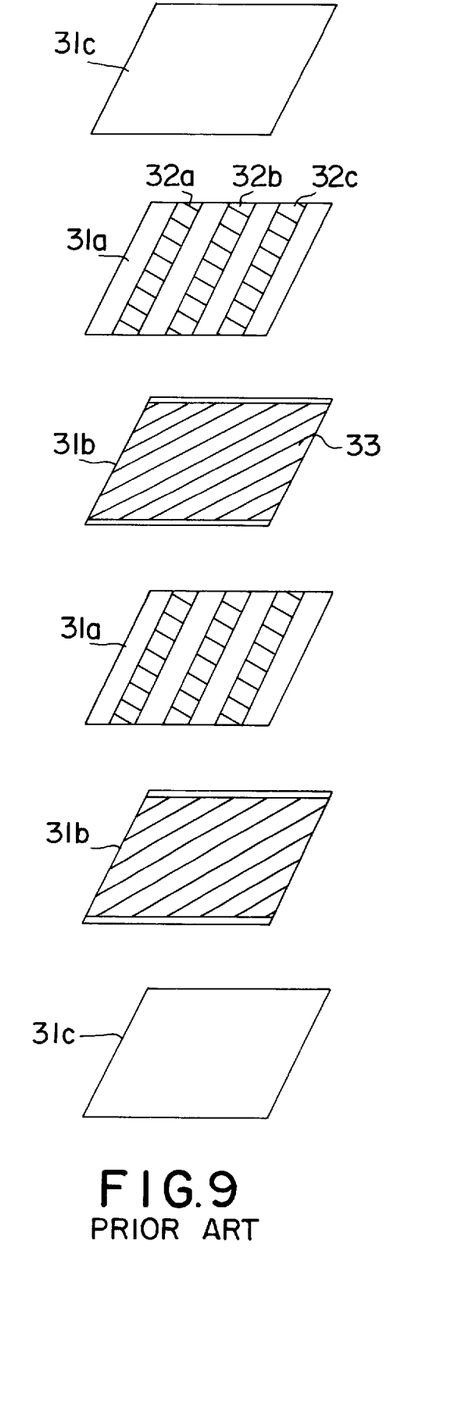
FIG. 9 is an exploded perspective view of a prior art multilayer feedthrough capacitor.
Figure 10:
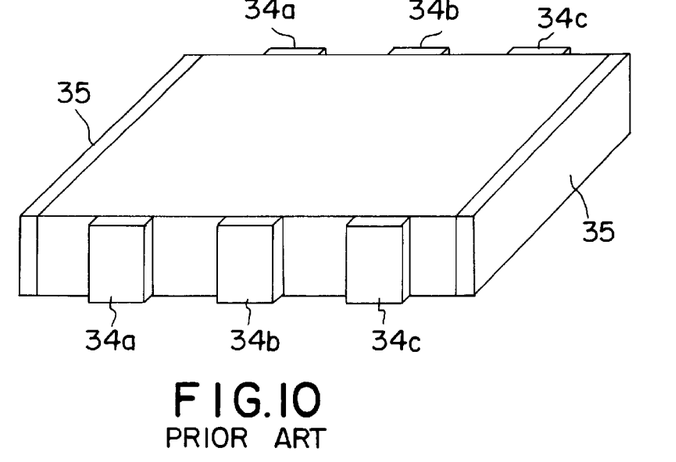
FIG. 10 is an external perspective view and FIG. 11 is an equivalent circuit diagram of the prior art multilayer feedthrough capacitor.
Figure 11:
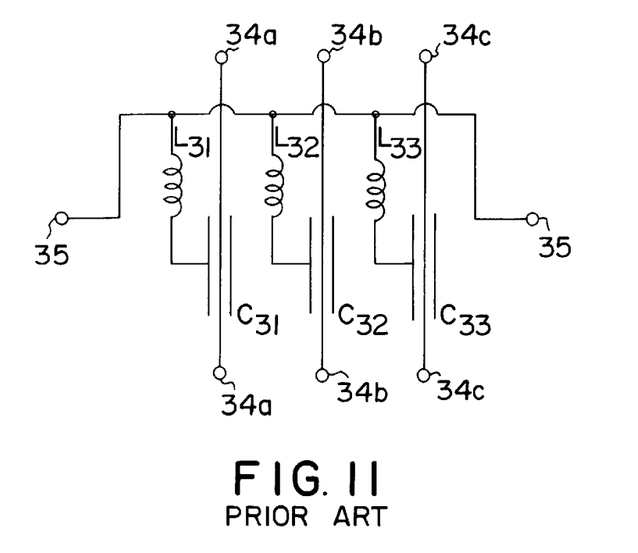

A representative example of prior art multilayer feedthrough capacitors will be explained by reference to drawings. FIG. 9 is an exploded perspective view to show an internal structure of a prior art multilayer feedthrough capacitor. FIG. 10 and FIG. 11 are an external perspective view and an equivalent circuit diagram of the multilayer feedthrough capacitor, respectively. As illustrated in FIG. 9, the multilayer feedthrough capacitor has an internal structure, wherein a dielectric sheet 31a with three signal feedthrough electrodes 32a, 32b and 32c formed thereon and a dielectric sheet 31b with an earth electrode 33 formed thereon are stacked alternately one over another between dielectric sheets 31c. Furthermore, as shown in FIG. 10, this multilayered structure has a first group of external electrodes 34a, 34b and 34c, which are connected to the signal feedthrough electrodes 32a, 32b and 32c, respectively, formed on each respective surface of one pair of its ends, and a second group of external electrodes 35, which are connected to the earth electrode 33, formed on each respective surface of the other pair of its ends.

This multilayer feedthrough capacitor is produced according to the process as described in the following: First, dielectric green sheets, on which signal feedthrough electrodes 32a, 32b and 32c, each with a specified width, have been deposited by a printing method using a conductive paste, are prepared. In the same way as above, dielectric green sheets, on each of which an earth electrode 33 of a broad width has been deposited, are prepared. Next, these dielectric green sheets are alternately stacked one over another so that the dielectic material is sandwiched between the signal feedthrough electrodes 32a, 32b and 32c and the earth electrode 33, and then the top and bottom surfaces of the foregoing stacked body are overlaid with a dielectric green sheet having no electrodes deposited thereon by printing, respectively. The stacked body is compressed and then fired. Afterwards, the first group of external electrodes 34a, 34b and 34c and the second group of external electrodes 35 are deposited on the end surfaces of the above fired body by applying a conductive paste to the end surfaces and then by baking the conductive paste applied thereto.

The multilayer feedthrough capacitor thus prepared has capacitors C31, C32 and C33 formed between the signal feedthrough electrodes 32a, 32b and 32c and the earth electrode 33, respectively, as shown in an equivalent circuit diagram of FIG. 11, where all the layers composing the multilayer feedthrough capacitor are combined and expressed by equivalent circuit constants.

With the prior art multilayer feedthrough capacitor, the inductance due to the earth electrode 33 becomes no longer negligible as the signal frequency is increased, and, as shown in FIG. 11, the multilayer feedthrough capacitor as a whole is in an equivalent state where apparent inductors L31, L32 and L33 are inserted between the capacitors C31, C32 and C33 and the second group of external electrodes 35. Since the capacitor C32 in the center is situated at a relatively long distance from the second group of external electrodes 35, the inductance of the inductor L32 becomes larger than the inductance of other inductors L31 and L33. Accordingly, the high frequency component of the noise signals that reach the second group of external electrodes 35 by way of the capacitor C32 may often return to the signal feedthrough electrode 32b. As a result, the insertion loss characteristics of the signal feedthrough electrode 32b, in particular, deteriorate in a high frequency band with resultant deterioration in the loss characteristics of the whole multilayer feedthrough capacitor.

Figure 12:
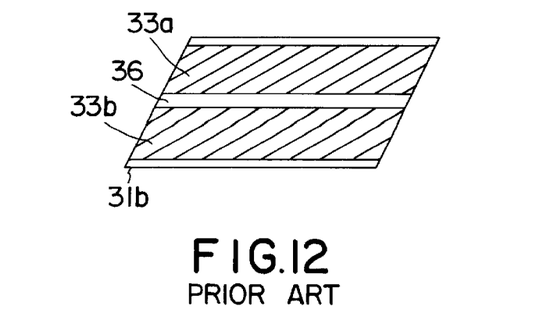
FIG. 12 is a perspective illustration to show an electrode structure of another prior art multilayer feedthrough capacitor.

As a multilayer feedthrough capacitor with reduced deterioration in insertion loss characteristics, one with split earth electrodes 33a and 33b using a slit 36 as shown in FIG. 12 is known. This capacitor is characterized by having the slit 36 arranged in the direction perpendicular to the longer axis of the rectangle shaped signal feedthrough electrodes 32a, 32b and 32c, thereby preventing the phenomenon of noise signals returning to the signal feedthrough electrode 32b from taking place readily.

However, even the multilayer feedthrough capacitor as described in the above has still room for an improvement in the insertion loss characteristics. In addition, the signal feedthrough electrodes 32a, 32b and 32c having a given width, respectively, and arranged in parallel with one another have caused a problem of producing crosstalk between two neighboring signal feedthrough electrodes.

SUMMARY OF THE INVENTION

An object of the present invention is to provide a multilayer feedthrough capacitor with its insertion loss characteristics improved and crosstalk suppressed.

One exemplary embodiment of the present invention of a multilayer feedthrough capacitor has a structure wherein a multilayer feedthrough capacitor, constructed within a dielectric body by stacking alternately one over another an earth electrode and a Plurality of signal feedthrough electrodes disposed on a single plane in parallel with one another, is characterized by having separating earth electrodes for separating the signal feedthrough electrodes arranged on the areas of dielectric material between the neighboring signal feedthrough electrodes and also having grounding connectors arranged at positions where the earth electrode is situated opposite to ends of the separating earth electrodes in the periphery of the earth electrode. Thus, by having the separating earth electrode arranged between the signal feedthrough electrodes and by having the grounding connectors Provided on the periphery of the earth electrode, it has become possible to suppress crosstalk produced between the neighboring signal feedthrough electrodes because the signal feedthrough electrodes are shielded electrically from one another. Furthermore, since the distance between a capacitor corresponding to the signal feedthrough electrode in the center and the external electrodes connected to the earth electrode becomes small, the insertion loss characteristics in the high frequency band are improved.

The other exemplary embodiment of the present invention of a multilayer feedthrough capacitor has cuts formed on the foregoing earth electrode at positions opposing to the areas of dielectric material existing between the signal feedthrough electrodes and the separating earth electrode.

Because of these cuts provided, the inductance of the earth electrode areas opposing to the areas between the signal feedthrough electrodes becomes larger than that of the earth electrode areas opposing to the signal feedthrough electrodes, and the earth electrode side of each respective capacitor corresponding to each respective signal feedthrough electrode is separated in the high frequency band. As a result, the insertion loss characteristics are further improved.

DESCRIPTION OF THE PREFERRED EMBODIMENTS

Next, an explanation will be made on a multilayer feedthrough capacitor as a first exemplary embodiment of the present invention with the help of FIG. 1 to FIG. 3.

Figure 1:
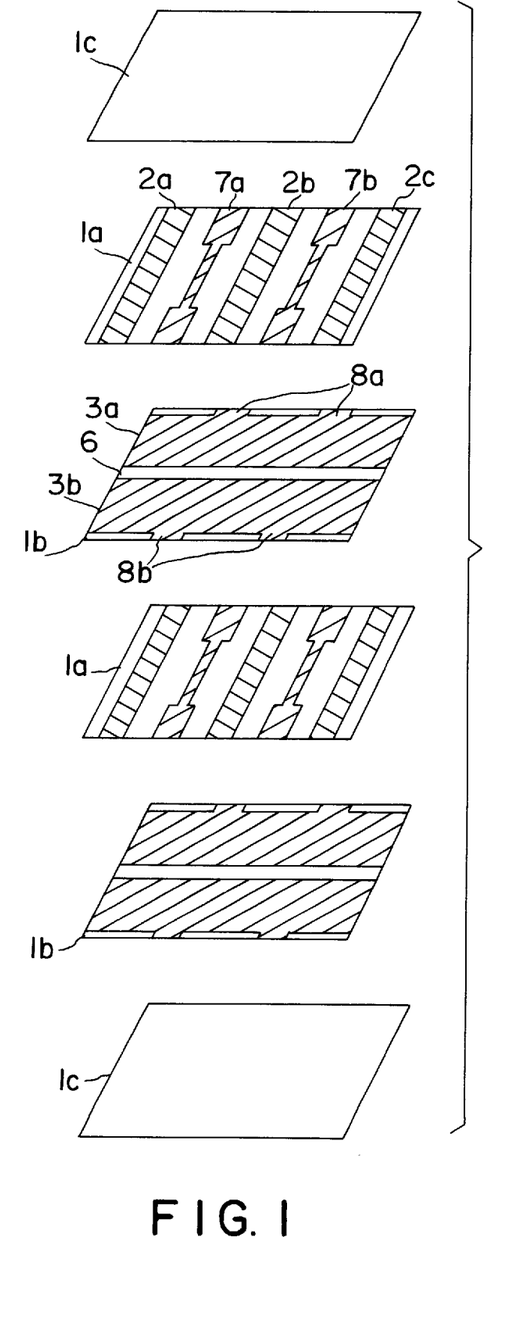
FIG. 1 is an exploded perspective view of a multilayer feedthrough capacitor as a first exemplary embodiment of the present invention.

As illustrated in FIG. 1, the internal structure of this multilayer feedthrough capacitor comprises a pair of rectangular shaped dielectric sheets 1c made of dielectric ceramic, a plurality of dielectric sheets 1a, on each of which signal feedthrough electrodes 2a, 2b and 2c and separating earth electrodes 7a and 7b are formed, and a plurality of dielectric sheets 1b, on each of which earth electrodes 3a and 3b are formed and separated from each other by a slit 6, with the foregoing dielectric sheets 1a and 1b alternately stacked one over another between the foregoing dielectric sheets 1c.

In other words, the multilayer feedthrough capacitor has an internal structure wherein signal feedthrough electrodes 2a, 2b and 2c and separating earth electrodes 7a and 7b, situated on an almost single plane, and earth electrodes 3a and 3b are stacked alternately one over another within a dielectric body. Each of the signal feedthrough electrodes 2a, 2b and 2c measures about 3 mm long by about 0.5 mm wide. The shape of each of the separating earth electrodes 7a and 7b is wider at both ends than the middle portion and measures about 0.5 mm wide at both ends and about 0.1 mm wide at the middle portion. The signal feedthrough electrodes 2a, 2b and 2c and the separating earth electrodes 7a and 7b are arranged on the dielectric sheet 1a in parallel to one another with an about 1 mm spacing between two neighboring electrodes so that the signal feedthrough electrodes and the separating earth electrodes 7a and 7b are placed alternately on the dielectric sheet 1a.

Protrusions 8a and 8b serving as grounding connectors are provided on the earth electrodes 3a and 3b at the positions corresponding to both ends of the separating earth electrodes 7a and 7b, respectively. Each of the earth electrodes 3a and 3b measures about 5 mm long and about 1.3 mm wide, and the protrusions 8a and 8b measure about 0.5 mm wide, respectively. Each of the dielectric sheets 1a, 1b and 1c measures about 5 mm long and about 3 mm wide.

Figure 2:
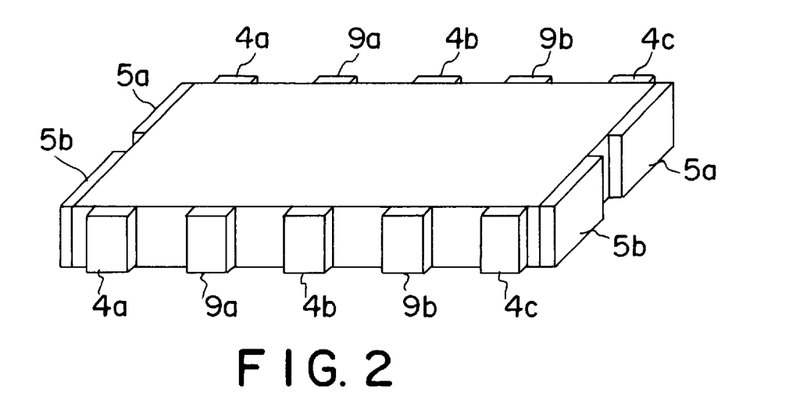
FIG. 2 is an external perspective view and FIG. 3 is an equivalent circuit diagram of the multilayer feedthrough capacitor.

As shown in FIG. 2, a first group of external electrodes 4a, 4b and 4c that are connected to the signal feedthrough electrodes 2a, 2b and 2c, respectively, and a third group of external electrodes 9a and 9b that are connected to both separating earth electrodes 7a and 7b and protrusions 8a and 8b, respectively, are provided on each of one pair of the end surfaces of the stacked body composed of the dielectric sheets 1a, 1b and 1c. A second group of external electrodes 5a and 5b that are connected to the earth electrodes 3a and 3b, respectively, are provided on each of another pair of the end surfaces of the stacked body.

The method for producing this multilayer feedthrough capacitor is almost the same as the one for the prior art multilayer feedthrough capacitor as shown in FIG. 9 to FIG. 12. First, dielectric green sheets, on each of which signal feedthrough electrodes 2a, 2b and 2c and also separating earth electrodes 7a and 7b are deposited by printing using a conductive paste, are prepared. Also, dielectric green sheets, on each of which earth electrodes 3a and 3b are deposited in the same way, are prepared. Next, these green sheets are stacked alternately one over another with both the upper most layer and lowest layer covered by dielectric green sheets that are not printed with any electrodes as described in the above, depending on the necessity. The stacked body is pressed tightly and then fired. After that, a conductive paste is applied on the end surfaces of the fired body and baked to complete the first group of external electrodes 4a, 4b and 4c and the third group of external electrodes 9a and 9b on each of one pair of the end surfaces and the second group of external electrodes 5a and 5b on each of another pair of the end surfaces.

Figure 3:
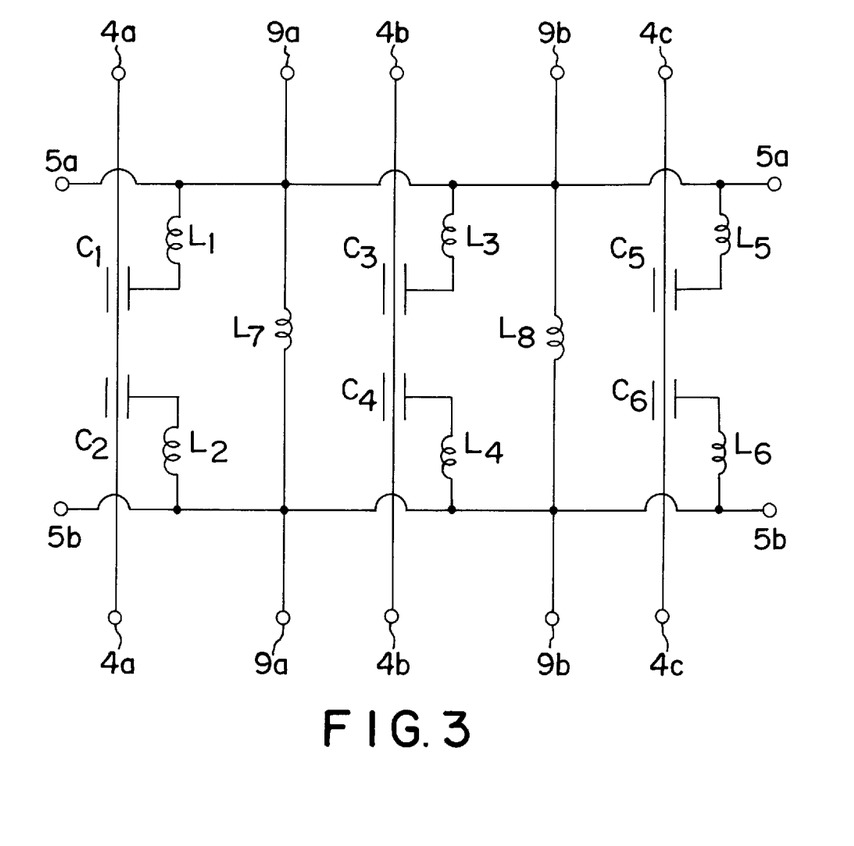

FIG. 3 is an equivalent circuit diagram of the foregoing multilayer feedthrough capacitor. Capacitors C1 and C2 are formed by the signal feedthrough electrode 2a and the earth electrodes 3a and 3b, capacitors C3 and C4 are formed by the signal feedthrough electrode 2b and the earth electrodes 3a and 3b and capacitors C5 and C6 are formed by the signal electrode 2c and the earth electrodes 3a and 3b, respectively. Apparent inductors L1 and L2 are inserted in series between the earth electrodes 3a and 3b side of the capacitors C1 and C2 and the second group of external electrodes 5a and 5b, respectively. Likewise, apparent inductors L3, L4, L5 and L6 are also inserted between the earth electrodes 3a and 3b side of the capacitors C3, C4, C5 and C6 and the second group of external electrodes 5a and 5b, respectively. Although apparent inductors exist on the signal feedthrough electrodes of the capacitors C1 to C6, these are omitted from the equivalent circuit diagram. Furthermore, although capacitors are not formed between the signal feedthrough electrodes 2a, 2b and 2c and the slit 6, the signal feedthrough electrodes 2a, 2b and 2c have apparent inductors, but these inductors are also omitted from the equivalent circuit diagram.

With the multilayer feedthrough capacitor of the foregoing structure, separating earth electrodes 7a and 7b connected to the third group of external electrodes 9a and 9b are placed between the signal feedthrough electrodes 2a, 2b and 2c. Because of this arrangement, each respective signal feedthrough electrode is electrically shielded and the electric field produced by each respective signal feedthrough electrode hardly affects the signals running through the neighboring signal feedthrough electrodes. Therefore, the crosstalk produced between the neighboring signal feedthrough electrodes can be suppressed effectively.

Moreover, the high frequency component of noises or the like produced by the signals flowing through the signal feedthrough electrode 2a, for example, is mostly directed to the second group of external electrodes 5a and 5b and to the third group of external electrode 9a through the capacitors C1 and C2 and the inductors L1 and L2. As a result, the high frequency component that tends to be directed to the earth electrodes 3a and 3b is prevented from returning to the feedthrough electrode 2a, thus contributing to the improvement of the insertion loss characteristics in the high frequency band.

This multilayer feedthrough capacitor has protrusions 8a and 8b provided on the earth electrode 3a and 3b, respectively. Because of this provision, the distance from the capacitors C3 and C4 that are formed between the middle signal feedthrough electrode 2b and the earth electrodes 3a and 3b to the second group of external electrodes 5a and 5b is, in effect, equal to the distance from the protrusions 8a and 8b, which is shorter than the distance to the second external electrodes 35 in the middle capacitor 32 of the prior art multilayer feedthrough capacitor. Therefore, when compared with the case where no protrusions 8a and 8b are provided, the inductance at the side of the earth electrodes of the capacitors C3 and C4 is reduced. As a result, the deterioration of the insertion loss characteristics in the high frequency band observed at the middle capacitors C3 and C4 is being kept small, contributing to the improvement of the overall insertion loss characteristics of the multilayer feedthrough capacitor.

Furthermore, this multilayer feedthrough capacitor employs the second group of split external electrodes 5a and 5b, each of which is connected to the split earth electrodes 3a and 3b, respectively. The splitting of the second group of external electrodes provides the same effect as the splitting of the earth electrodes does, resulting in more excellent insertion loss characteristics than the case of the prior art multilayer feedthrough capacitor wherein the second external electrodes 35 are employed.

Although a configuration with a broader width for each respective end than the width of the middle portion is employed with the separating earth electrodes 7a and 7b in the present exemplary embodiment, the present invention is not limited to this configuration only. For example, a simple narrow tablet like configuration is acceptable although the degree of improvement in the insertion loss characteristics may be smaller than that achieved by the present exemplary embodiment. More specifically, the high frequency component of the signal that enters into the signal feedthrough electrodes 2a through the first group of external electrodes tends to flow into the second group of external electrodes 5a and the third group of external electrodes 9a through the capacitor C1 and inductor L1. However, when the impedance of the second group of external electrodes 5a and third group of external electrodes 9a is large, the high frequency component is reflected by these external electrodes and liable to returning again to the first group of external electrodes 4a after passing through the separating earth electrode 7a and then the capacitor C2 and inductor L2. As a result, the effectiveness of having the capacitor 31 divided into the capacitors C1 and C2 by employing the split earth electrodes 3a and 3b, which is observed on the improvement of the insertion loss characteristics, is reduced.

In contrast, when a configuration with a narrower width in the middle portion is employed, it becomes, in effect, equal to the case, wherein inductors L7 and L8 as shown in FIG. 3 are inserted in the middle portion and the earth electrodes can be separated on the separating earth electrodes 7a and 7b in the high frequency band, thus enabling the separation of the signal feedthrough electrodes 2a, 2b and 2c, respectively, without hurting the effectiveness of using the split earth electrodes 3a and 3b in improving the performance of the multilayer feedthrough capacitor. Therefore, it is preferred to use a configuration that has a larger width at each respective end than in the middle portion as the configuration of the separating earth electrodes 7a and 7b.

Figure 4:
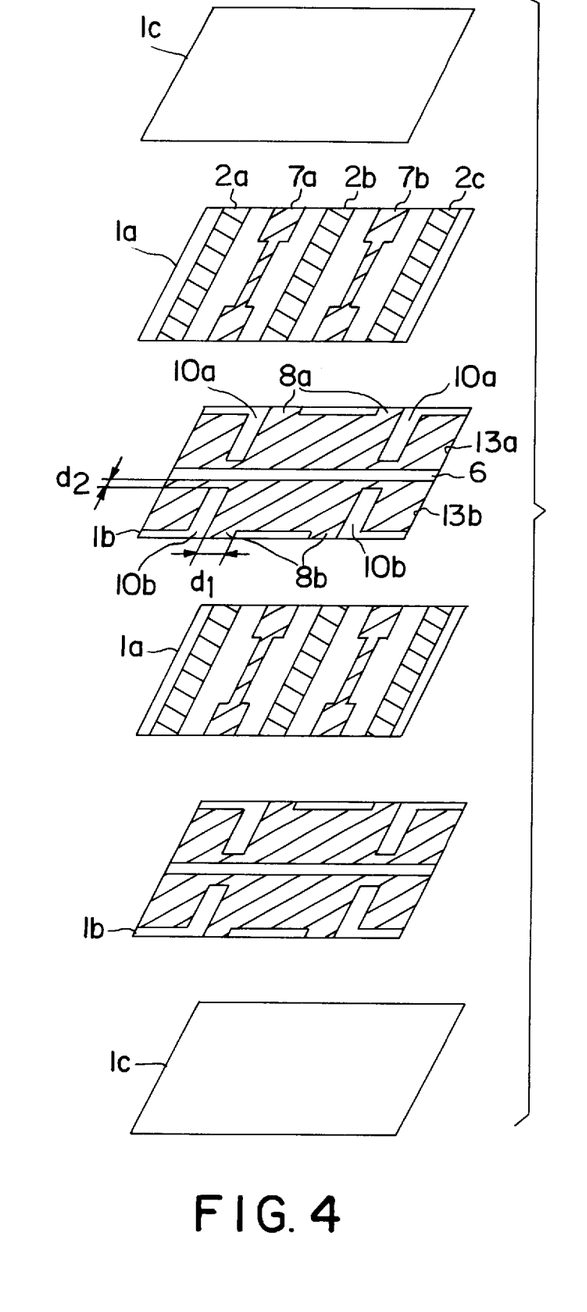
FIG. 4 is an exploded perspective view of a multilayer feedthrough capacitor as a second exemplary embodiment of the present invention.

Next, an explanation will be made on a multilayer feedthrough capacitor as a second exemplary embodiment of the present invention with the help of FIG. 4 to FIG. 6. As shown in FIG. 4, the multilayer feedthrough capacitor of the present exemplary embodiment uses earth electrodes 13a and 13b which are the same as the earth electrodes 3a and 3b of FIG. 1 except for having rectangle shaped cuts 10a and 10b, respectively. The cuts 10a and 10b are located in areas opposing to the regions between the signal feedthrough electrodes 2a, 2b and 2c and the separating earth electrodes 7a and 7b. Moreover, these cuts 10a and 10b extend deeply into the earth electrodes 13a and 13b so that the width d2 of the remaining earth electrodes after the cuts, or the distance between the ends of the cuts and the slit 6, becomes smaller than the width d1 of the protrusions 8a and 8b. More specifically, in case of the present exemplary embodiment, the width d1 of the protrusions 8a and 8b is about 0.5 mm and the electrode width d2 is about 0.1 mm.

Figure 5:
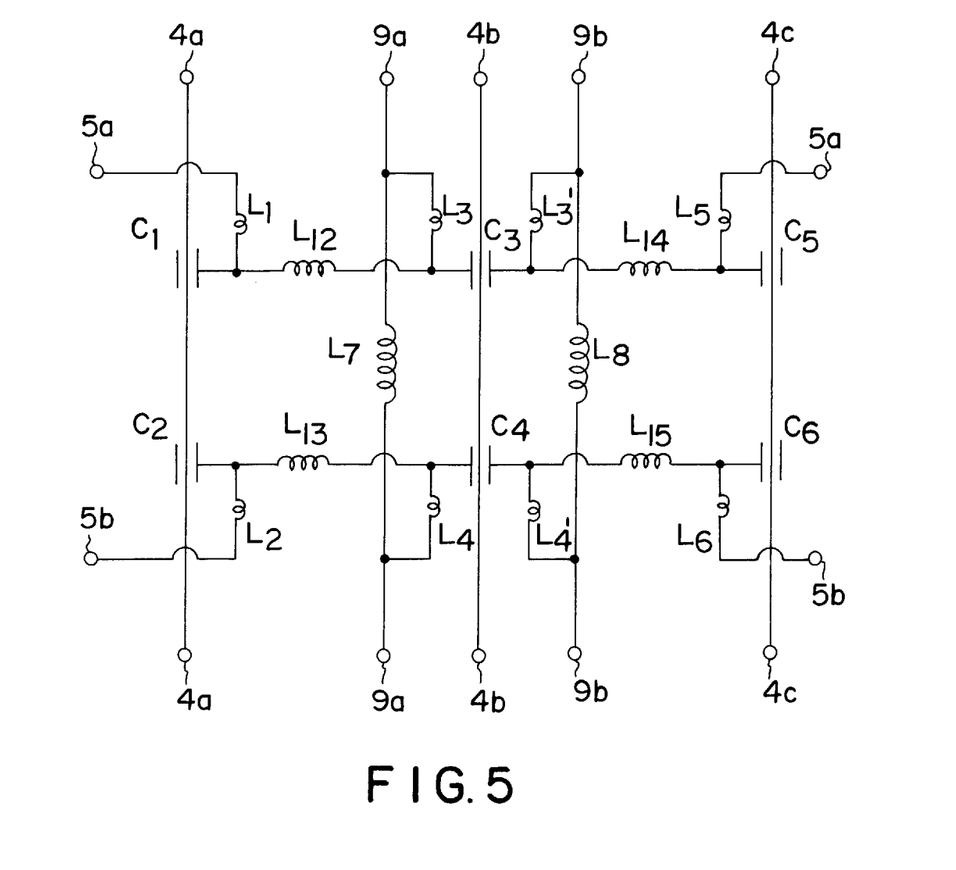
FIG. 5 is an equivalent circuit diagram of the multilayer feedthrough capacitor and FIG. 6 is a perspective illustration to explain the relationship between the electrode structure and the equivalent circuit diagram of the multilayer feedthrough capacitor.
Figure 6:
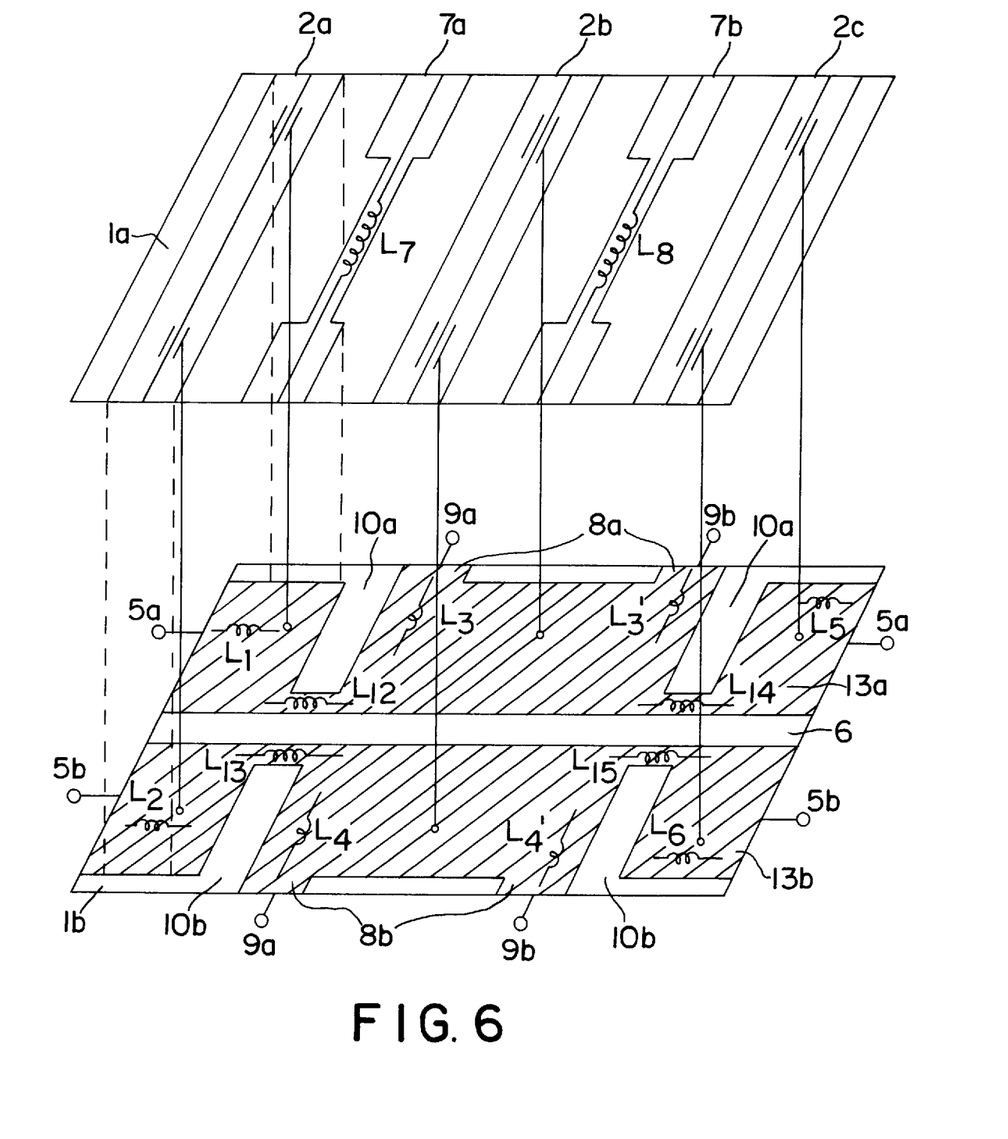

FIG. 5 shows an equivalent circuit diagram and FIG. 6 shows the relationship between the electrode structure and the equivalent circuit diagram of this multilayer feedthrough capacitor, respectively. There are capacitors C1 to C6 and inductors L1 to L6 in the same way as observed in the case of FIG. 2. Due to the existence of the cuts 10a and 10b, inductors L12, L13, L14 and L15, which are produced on the earth electrodes 13a and 13b in areas corresponding to the regions between neighboring signal feedthrough electrodes, are added newly. However, apparent inductors that are produced on the signal feedthrough electrodes 2a, 2b and 2c are not indicated on the circuit diagram.

The effects of providing these cuts 10a and 10b will be explained in the following: When a comparison in inductance is made between the inductor L1 and the inductor L12, the inductance of the inductor L12 is larger than that of the inductor L1 due to the narrow electrode width d2 at the cuts 10a and 10b. Likewise, the inductance of the inductor L13 is larger than that of the inductor L2. The behavior of the high frequency component of signals in the regions of capacitors C1 and C2 and inductors L1, L2, L12, L13 and L7 will be analyzed with the help of FIG. 5. Since the inductance of the inductor L12 is larger than that of inductor L1, the high frequency component that enters into a first external electrode 4a mostly flows to a second external electrode 5a and hardly flows to a third external electrode 9a. Because of this, the signal inputted from the first external electrode 4a to the signal feedthrough electrode 2a does not affect the neighboring signal feedthrough electrode 2b. The effects of having the inductors L13, L14 and L15 in place are the same as the case of the inductor L12. Therefore, by making each respective inductance of the inductors L12 to L15 larger than that of the inductors L1 to L6, the adverse effect of the high frequency component of signals flowing through a certain capacitor is reduced, thereby suppressing the generation of crosstalk between the signal feedthrough electrodes greatly.

Furthermore, as the difference in inductance among the inductors L12 to L15 and also among the inductors L1 to L6 becomes the larger, the adverse effect of the high frequency component of signals flowing through a certain capacitor, which is inflicted on the earth electrodes of other capacitors, becomes the smaller. Therefore, it is preferable to make this difference as large as possible.

Next, an explanation will be made on the depth of the cuts 10a and 10b. Take the inductance looked from the external electrodes, for instance. In case of the inductance between the third external electrode 9a and the second external electrode 5a, the inductance becomes larger as the channel, through which the electric current flows between both electrodes, becomes longer. Because of this, as the cut 10a extends more deeply, or the electrode width d2 becomes narrower, the inductance of the inductor L12 tends to be larger. In other words, as the inductance of the inductor L12 becomes larger, the extent of the adverse effect that is inflicted on the earth electrodes of other capacitors by the high frequency component of signals flowing through the capacitor C1 tends to become smaller.

Therefore, in order to make the crosstalk further smaller, the extent of the cuts 10a and 10b should be made as large as possible. In other words, the bottom ends of the cuts 10a and 10b are preferred to be extending as closely as possible to the slit 6. However, an excessively deep cutting may bring about the danger of tearing off the earth electrodes 13a and 13b. Therefore, the depth of the cutting should be controlled not to tear off the earth electrodes 13a and 13b. More specifically, the electrode width d2 of the present exemplary embodiment is preferably not less than 0.02 mm.

On the other hand, when the depth of the cut 10a is too small, the inductance of the inductors L12 and L13 becomes small, resulting in that part of the high frequency component of signals flowing through the signal feedthrough electrode 2a gets into the third external electrode 9a through the inductors L3 and L4. Since the third external electrode 9a is connected electrically with the signal feedthrough electrode 2b through the inductors L3 and L4 and the capacitors C3 and C4, the above affects somewhat the signals flowing through the signal feedthrough electrode 2b. In order to avoid this adverse effect, it is preferred that the inductance of the inductors L12 and L13 is made larger than that of the inductors L3 and L4. Likewise, it is preferred that the inductance of the inductors L14 and L15 is made larger than that of inductors L3' and L4'. This can be achieved by making the electrode width d2 at the cuts 10a and 10b smaller than the width d1 of the protrusions 8a and 8b. Moreover, as the electrode width d2 becomes the smaller than the width d1, the larger becomes the difference in inductance between both inductors, thus making it hard for crosstalk to be produced between the signal feedthrough electrodes.

Figure 7:
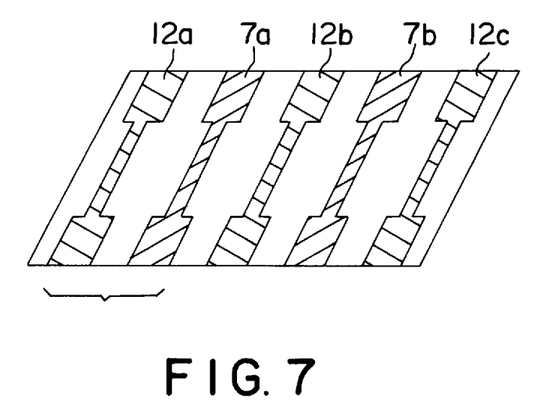
FIG. 7 is a perspective view of the signal feedthrough electrodes as employed in a multilayer feedthrough capacitor as a third exemplary embodiment of the present invention and FIG. 8 is part of an equivalent circuit diagram of the multilayer feedthrough capacitor.

Next, a multilayer feedthrough capacitor will be explained as a third exemplary embodiment of the present invention with the help of FIG. 7 and FIG. 8. As illustrated in FIG. 7, the multilayer feedthrough capacitor of the present exemplary embodiment uses signal feedthrough electrodes 12a, 12b and 12c, each having a configuration with larger widths at both ends than the width in the middle portion in place of the signal feedthrough electrodes 2a, 2b and 2c as shown in FIG. 1 and FIG. 4. More specifically, the width at both ends measures about 0.5 mm and the width in the middle portion measures about 0.1 mm. In other areas of the structure than the above, the multilayer feedthrough capacitor of the present exemplary embodiment is the same as in the first and second exemplary embodiments of the present invention.

Figure 8:
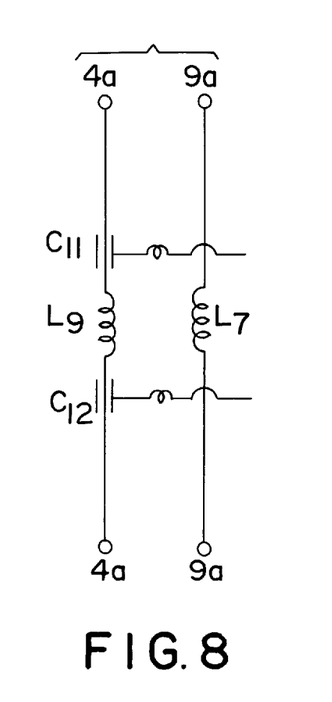

Thus, by making the middle portion of the signal feedthrough electrodes narrower than the ends thereof, an inductor L9 is inserted in series to the signal feedthrough electrode 12a between the capacitors C11 and C12 in the high frequency band as shown in FIG. 8. Because of this, a better separation between the capacitors C11 and C12 is assured, thereby contributing further to the improvement in the insertion loss characteristics.

The exemplary embodiments of the present invention as described in the above are Preferred ones and the present invention is not limited to these exemplary embodiments only. For example, although an explanation was made about multilayer feedthrough capacitors with three signal feedthrough electrodes in the foregoing exemplary embodiments, the present invention is equally applicable to multilayer feedthrough capacitors with signal feedthrough electrodes ranging in number from two to more. Although an exemplary embodiment showed use of a slit to divide one earth electrode into two sections, the earth electrode can be divided into three or more sections by using two or more of slits. However, the earth electrode may be used without any splitting at all on the other hand. Therefore, any modifications of the exemplary embodiments, which are in accordance with the true spirit of and within the scope of the present invention, are all contained in the scope of what is claimed by the present invention.

What is claimed is:

1. A multilayer feedthrough capacitor comprising:

a dielectric body;

a group of electrodes, each of which is formed of a plurality of signal feedthrough electrodes and a separating earth electrode arranged between said signal feedthrough electrodes, and is disposed in parallel with one another on a first single plane with part of said dielectric body situated so as to have one electrode separated from another; and an earth electrode disposed on a second single plane opposing to said first single plane and provided with a grounding connector on a periphery of said earth electrode at a position opposing to an end of said separating earth electrode, wherein said group of electrodes and said earth electrode are stacked alternately in said dielectric body, wherein a shape of said separating earth electrode shows a smaller width in a middle portion than a width at an end thereof, and said earth electrode is divided by a slit formed along a direction perpendicular to a longer axis of said signal feedthrough electrodes, wherein said earth electrode has a cut in an area opposing to an area between one of said signal feedthrough electrodes and said separating earth electrode.

2. The multilayer feedthrough capacitor according to claim 1, wherein said cut extends from an end of said earth electrode to a vicinity of said slit.

3. The multilayer feedthrough capacitor according to claim 2, wherein said grounding connector comprises a protrusion, and a width of said earth electrode extending from a lower end of said cut to said slit is smaller than a width of said protrusion.

4. A multilayer feedthrough capacitor comprising:

a dielectric body;

a group of electrodes, each of which is formed of a plurality of signal feedthrough electrodes and a separating earth electrode arranged between said signal feedthrough electrodes, and is disposed in parallel with one another on a first single plane with part of said dielectric body situated so as to have one electrode separated from another; and an earth electrode disposed on a second single plane opposing to said first single plane and provided with a grounding connector on a periphery of said earth electrode at a position opposing to an end of said separating earth electrode, wherein said group of electrodes and said earth electrode are stacked alternately in said dielectric body, wherein a shape of said separating earth electrode shows a smaller width in a middle portion than a width at an end thereof, and said earth electrode is divided by a slit formed along a direction perpendicular to a longer axis of said signal feedthrough electrodes, wherein a shape of each signal feedthrough electrode of said plurality of signal feedthrough electrodes shows a smaller width in a middle portion than a width at an end thereof, and wherein said earth electrode has a cut in an area opposing to an area between one of said plurality of signal feedthrough electrodes and said separating earth electrode.

5. The multilayer feedthrough capacitor according to claim 4, wherein said cut extends from an end of said earth electrode on said second signal plane to a vicinity of said slit.

6. The multilayer feedthrough capacitor according to claim 5, wherein said grounding connector comprises a protrusion, and a width of said earth electrode on said second signal plane extending from a lower end of said cut to said slit is smaller than a width of said protrusion.

* * * * *